United States Patent [19]

Michener et al.

[11] Patent Number: 4,745,543
[45] Date of Patent: May 17, 1988

[54] FRONT PANEL FOR A PROCESS CONTROLLER

[75] Inventors: Robert Michener, Warrington; Thomas Frederiksen, Jr., Hatboro, both of Pa.

[73] Assignee: Fischer & Porter Co., Warminster, Pa.

[21] Appl. No.: 56,363

[22] Filed: May 28, 1987

Related U.S. Application Data

[63] Continuation of Ser. No. 294,528, Aug. 20, 1981, abandoned.

[51] Int. Cl.⁴ .............................................. G06F 3/14
[52] U.S. Cl. .................................. 364/188; 364/146; 364/181; 340/722; 340/754; 340/771
[58] Field of Search ............... 364/188, 189, 171, 144, 364/146, 181; 340/709, 714, 712, 722, 753, 754, 771

[56] References Cited

U.S. PATENT DOCUMENTS

| | | | |
|---|---|---|---|
| 3,422,418 | 1/1969 | Simoneau | 340/709 |
| 3,474,438 | 10/1969 | Lauher | 340/722 |
| 3,971,013 | 7/1976 | Challoner et al. | 340/365 C |
| 3,973,166 | 8/1976 | Maloney | 340/754 |
| 3,976,981 | 8/1976 | Bowden | 364/189 |
| 3,987,351 | 10/1976 | Appelberg et al. | 364/189 |
| 4,001,807 | 1/1977 | Dallimonti | 340/525 |
| 4,071,745 | 1/1978 | Hall | 364/146 |
| 4,074,354 | 2/1978 | Nakagawa et al. | 364/188 |
| 4,109,309 | 8/1978 | Johnstone et al. | 364/171 |
| 4,118,772 | 10/1978 | Takada | 364/188 |
| 4,153,198 | 5/1979 | Eki et al. | 364/188 |
| 4,180,860 | 12/1979 | Driscoll et al. | 364/188 |
| 4,186,392 | 1/1980 | Holz | 340/712 |
| 4,189,765 | 2/1980 | Kotalik et al. | 364/188 |
| 4,224,615 | 9/1980 | Penz | 340/712 |
| 4,253,044 | 2/1981 | Smith | 340/714 |
| 4,290,061 | 9/1981 | Serrano | 340/712 |
| 4,291,303 | 9/1981 | Cutler et al. | 340/712 |
| 4,303,973 | 12/1981 | Williamson et al. | 340/722 |
| 4,386,347 | 5/1983 | Cutler et al. | 340/365 C |

OTHER PUBLICATIONS

Wood, G. G., "Alternative Methods of Computer Control", Control, Nov. 1968, pp. 941-946.

Primary Examiner—Michael R. Fleming
Assistant Examiner—John R. Lastova
Attorney, Agent, or Firm—Michael Ebert

[57] ABSTRACT

A front display panel for an industrial process control instrument which acts to maintain a process variable, such as flow rate, at a desired value. The instrument compares a signal representing the variable with an adjustable set point to produce an output signal that reflects the deviation of the variable from the set point, the output signal being applied to a final control element such as a valve which governs the process variable. The front panel of the instrument includes a bar graph indicator for the process variable, a bar graph indicator for the set point and a bar graph indicator for the output signal, all three indicators being of the gas discharge type and being integrated into a single panel defining a sealed envelope filled with an ionizable gas and provided with electrodes. Also integrated into the panel are touch-sensitive switches and other control and indicating elements.

4 Claims, 1 Drawing Sheet

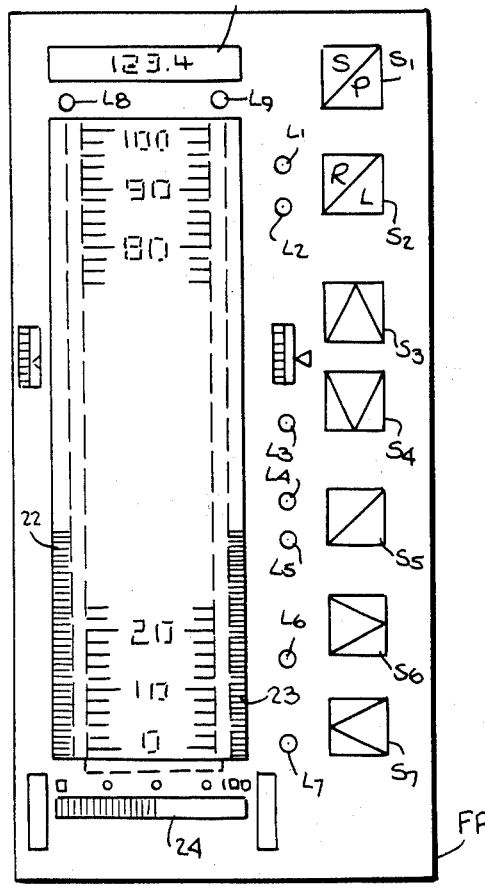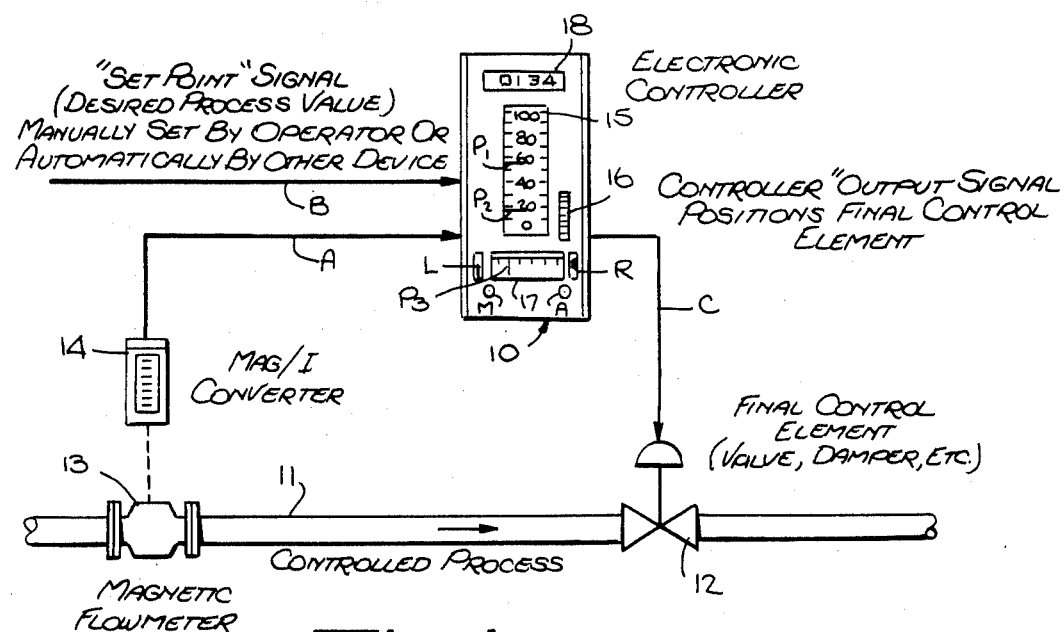

FRONT PANEL FOR A PROCESS CONTROLLER

This application is a continuation of application Ser. No. 294,528, filed Aug. 20, 1981, now abandoned.

BACKGROUND OF INVENTION

This invention relates generally to industrial process control instruments, and more particularly to a front panel for such instruments constituted by a single gas-discharqe display panel which integrates several indicators and control elements.

An electronic controller is a component in a process control loop that is subject to disturbances, the controller acting in conjunction with other devices to maintain a process variable at a desired value. The factor controlled may be flow rate, pressure, viscosity, liquid level, or any other process variable. In operation, the electronic controller receives, in terms of corresponding input signals, both the process variable and a set point, and it compares these electrical values to produce an output signal that reflects the deviation of the process variable from the set point. This output signal, when applied to a final control element, will directly or indirectly govern the process variable.

Thus one input signal to a controller may be derived from a flowmeter whose reading is converted into a corresponding electrical value, and the output signal may be impressed on a flow-regulating valve which is caused to assume an intermediate position between open and closed at which the flow rate conforms to the set point. The set point generator may be an internal component of the controller or a remotely-controlled device.

Variations in controller action are obtained by adjustment of parameters associated with the control modes and are available in several combinations. These modes of control action which are combined to adjust the controller output signal are known as proportional, reset and derivative.

Proportional action produces an output signal proportional to the deviation of the controlled process variable from the set point. The amount of deviation in terms of percentage required to move the final control element through the full range is known as the proportional band. Automatic reset action, also known as integral action, produces a corrective signal proportional to the length of time the controlled variable has been away from the set point, while derivative action, also known as rate action, produces a corrective signal proportional to the rate at which the controlled variable is changing. Manual reset action is an operator-actuated potentiometer controlled to produce a corrective signal directly proportional to the magnitude of the adjustment.

The concern of the present invention is with the front panel of an electronic controller, and for purposes of background we shall consider the front panel included in the Fischer & Porter (Warminster, Pa.) "Total View Electronic Controller" as described in their Instruction Bulletin for the Series 53EG4000 published in 1979; for this instrument is typical of commercially-available electronic controllers.

The front face of the Total View Electronic Controller displays process, set point and final control element information and it also contains those operator controls necessary for the manual and automatic operation of the instrument.

Thus the front panel includes a process variable and set point indicator consisting of a common direct reading vertical scale graduating from 0-100% and two meter-movement pointers; one in red to indicate process, and the other in black to indicate set point along the same scale. Also mounted on the front panel below this indicator is an output meter having a 0-100% horizontal scale whose pointer indicates the direct current output of the meter.

To permit selection of automatic or manual operation, two push-buttons are provided on the front panel for this purpose. To effect operation of the final control valve in either direction when the manual transfer push-button is depressed, two manual drive push-buttons are provided. Also on the front panel is a set point thumb wheel which turns a set point potentiometer to provide the necessary set point voltage.

Thus the front panel of the typical electronic controller consists of several discrete indicators, switches and other control elements in a fairly complicated and costly assembly which leaves much to be desired in terms of human engineering and modern industrial design.

When solid-state indicators such as LED, LCD and gas-discharge displays are commercially available, and indicators of these types can be used to replace the electromechanical indicators installed on the front panel of conventional controllers, the resultant display arrangement would still be comprised of discrete components and have the drawbacks thereof.

SUMMARY OF INVENTION

In view of the foregoing, the main object of this invention is to provide a front display panel for an electronic controller having a bar graph indicator for the process variable, a bar graph indicator for the set point and a bar graph indicator for the controller output, these indicators all being integrated in a single gas discharge display panel.

Also an object of the invention is to provide an integrated gas discharge display panel of the above-type which also incorporates therein a gas discharge digital indicator to provide a digital reading of the process variable or of the set point.

Still another object of this invention is to provide an integrated gas discharge display panel for an electronic controller which also includes spot indicators and touch-sensitive switches so the front panel of the controller is essentially a solid-state device devoid of physically-operated control elements. A significant feature of the invention is that it provides a clutter-free front panel display of exceptional simplicity which facilitates controller operation in a manner compatible with the highest standards of human engineering.

Briefly stated, these objects are attained in a front display panel for an industrial process control instrument which acts to maintain a process variable such as flow rate at a desired value, the front panel displaying process, set point and final control element information and containing those operator controls necessary for the manual and automatic operation of the instrument.

The front display panel is constituted by a sealed gas discharge envelope having parallel face and base plates and filled with an ionizable gas. Conductive-electrodes are formed on the plates to define first and second parallel bar graph indicators having a common scale, a third bar graph indicator having a separate scale, and a digital indicator; the first indicator displaying the process variable in analog terms, the second indicator displaying the set point in analog terms, and the third indicator displaying the output in analog terms. The digital indicator displays the digital value of either the set point or the process variable.

OUTLINE OF DRAWINGS

For a better understanding of the invention as well as other objects and further features thereof, reference is made to the following detailed description to be read in conjunction with the accompanying drawings, wherein:

FIG. 1 schematically shows a typical electronic controller in an industrial process control system, the front panel of the controller having conventional indicators and control means which in a front panel in accordance with the invention are replaced by a single gas-discharge;

FIG. 2 is a front display panel in accordance with the invention;

FIG. 3 is a transverse section taken through the panel; and

FIG. 4 is a schematic circuit diagram of the circuits associated with the panel indicators.

DESCRIPTION OF INVENTION

Conventional Process Control System:

Referrring now to the drawings, and in particular to FIG. 1, there is shown a typical electronic controller, generally designated by numeral 10, included in an industrial process control system. The process which is being controlled involves the flow of a fluid through a line 11, the rate of flow being regulated by a valve 12 which acts as the final control element in a process control loop that includes controller 10.

In order to determine flow rate, a magnetic flowmeter 13 is interposed in flow line 11 in advance of valve 12 to produce a flow rate signal. This signal is applied to a converter 14 to provide a process variable current that is applied through channel A to controller 10 where it is compared with a set point signal applied through channel B to produce an output signal that represents the deviation of the process variable from the set point. The output signal of the controller is applied through channel C to valve 12 to cause the valve to adjust the flow rate to an extent necessary to cause the process variable to match the set point. In practice, the output is a d-c signal.

Mounted on the front panel of controller 10 is a process variable and set point indicator 15 having a single direct reading vertical 0–100% scale that is graduated in say, 2% increments. Indicator 15 has two meter movement pointers $P_1$ and $P_2$, the first indicating the set point and the second the process variable. The set point may be automatically set from a remote station or it may be manually adjusted by an operator, in which case use is made of a thumb wheel 16 mounted on the front panel, Thumb wheel 16 operates a set point potentiometer that produces a voltage representing the desired set point, this being indicated by the set point pointer on indicator 15. The thumb wheel is mounted to the right of indicator 15, and when rotated, it acts to adjust the potentiometer slider arm.

Mounted on the front panel below indicator 15 is an output meter 17 having a 0–100% horizontal scale. This may be graduated in, say, 5% increments, the pointer $P_3$ thereon indicating the direct current output. Also mounted on the front panel are manual and automatic push-button switches M and A, respectively. When buttum M is depressed, the controller operates in the manual mode; and when button A is depressed, it operates in the automatic mode. These buttons may be of the illuminated type, such that when button A is pressed and released, it lights up, the same action occurring when button B is pressed and released.

Also provided is a digital indicator 18 of any known type which gives a digital readout of the set point or the process variable, depending on how it is connected.

Right and left manual drive push-buttons R and L are provided to permit manual operation of valve 12 when manual transfer push-button M is depressed. Right push-button R, when operated, will cause a gradual increase in process flow. Operating left push-button L will cause a gradual decrease in flow. The pointer of output meter 17 will always move toward whichever manual drive push-button is depressed.

Solid State Front Panel

The principles of gas discharge displays are well known and are set forth in detail in the section on Gas Discharge Displays included in the text "Electronic Displays" by E. G. Bylander in the Texas Instruments Electronic Series published by the McGraw-Hill Book Company (1979).

Gas discharge bar graph panel displays are commercially available, one such display being produced by the Burroughs Corporation, Electronic Components Division, of Plainfield, New Jersey. In a panel of this type, use is made of a rear ceramic substrate and a front glass plate spaced therefrom to form a solid-state device that is vibration-proof and shock resistant. A conductive material is screened onto the rear substrate in the form of electrode segments. Also screened on the substrate to enhance the contrast ratio is a black dielectric material. Transparent anodes and anode contacts are applied to the front glass, and a spacer is inserted between the front glass and the rear substrate, the panel then being sealed to form an envelope that is filled with an ionizable neon gas mixture.

Operationally, the bar graph uses the glow transfer principle by which a glow is established at the reset cathode, the glow then being transferred up the bars. The height of the bars is determined by the amount of time that the front anode is on for each bar, the glow being extinguished when the anode is turned off. This makes it possible to produce bar heights at any point from zero to say two hundred elements.

Gas discharge panel displays are also commercially available such as the "Panaplex" panel produced by the Burroughs Corporation. These displays have 4 to 16 digits, each digit station being in a seven-segment figure-of-eight format, which, when selectively excited, create the digits 0 to 9 in a neon orange color. Gas discharge panel displays are also available in a dot matrix format to provide alpha-numeric characters. A single excited dot or spot would, of course, provide a pilot light.

Also well known are touch-sensitive capacitive switches which are actuated simply by bringing a finger in contact with the switch area, no pressure being necessary.

In a solid-state gas discharge panel in accordance with the invention, all analog bar graph and digital indicators for an electronic controller of the type shown in FIG. 1 as well as the operating controls therefor are integrated into a single gas discharge front display panel FP as shown in FIGS. 2 and 3. Display panel FP is composed of a front glass plate 19 and a rear plate or substrate 20, spacers 21 being provided to define a sealed gas discharge envelope filled with a suitable ionizable neon gas mixture.

The plates have electrodes and contacts formed thereon in configurations appropriate to the functions to be carried out. Thus there are electrodes in a configuration to create a bar graph display, as well as electrodes in a separate panel zone to create a digital readout. Also provided are electrodes to create pilot lights, and electrodes to define capacitive touch-sensitive switches. In the case of the switches, the neon mixture in the panel serves merely as a dielectric. However, the touch-sensitive switches may be arranged to operate in the manner of switches such as those used for elevator buttons which are caused to glow when touched to indicate a switch action.

Panel FP is provided with a gas discharge bar graph indicator 22 which is responsive to the process variable and a parallel bar graph indicator 23 responsive to the set point, these two vertical bar graphs being associated with a common 0-100% scale inscribed on the glass plate. Thus instead of pointers as in FIG. 1, the height of the process variable and the set point bar graphs are read on the same scale.

Below vertical bar graphs indicators 22 and 23 is a relatively short horizontal gas discharge bar graph indicator 24 providing an analog output reading comparable to that produced by output meter 17 in FIG. 1. Above bar graph indicators 22 and 23 is a horizontal gas discharge digital readout 25 whose function is the same as readout 18 in FIG. 1.

Also provided on front panel FP is a vertical row of touch-sensitive capacitive switches $S_1$ to $S_7$, whose electrodes are formed on the plates of the panel in the same fashion as the electrodes for the bar graph and digital gas discharge displays. Associated with this row of switches is a corresponding row of individual gas discharge spots defining pilot lights $L_1$ to $L_9$, each of which is caused to turn on to produce a neon glow when the associated switch is actuated by touch.

The solid-state switches carry out control functions corresponding to those performed by the mechanical push-button switches included in the controller 10 in FIG. 1 as well as the functions performed by the thumb wheel for set point adjustment.

Switch $S_2$ permits a transfer of the controller from local to remote set point. When the controller operates in the manual mode, touching switch $S_6$ produces a gradual increase in output, resulting in an increase in bar graph output indicator 24 toward the right. Touching switch $S_7$ produces a gradual decrease in output resulting in a decrease in bar graph 24 toward the left, these same functions being performed by push-button switches A and B in FIG. 1.

Instead of a thumb wheel, the set point is under the control of touch-sensitive switches $S_3$ and $S_4$. Operation of switch $S_3$ causes an increase in the set point value, while operation of switch $S_4$ causes a decrease in this parameter. Switch $S_5$ permits transfer of the controller from its automatic to manual mode and corresponds to the separate M and A buttons on the controller of FIG. 1.

Obviously, the front panel may include other gas discharge indicators and touch-sensitive capacitive switches in order to carry out other electronic controller operations. Thus an additional gas discharge display digital readout is provided to indicate, with respect to the digital count representing the process variable, its exact value in engineering units. By actuating switch $S_1$, this digital display can be transferred to read set point, lighting pilot lights $L_8$ and $L_9$ accordingly.

In practice, instead of capacitive touch switches which are incorporated in the gas discharge display panel, use may be made of a sheet type, mechanical touch switch assembly which can be adhered onto the gas discharge display panel, such as touch switches of the type marketed by DoraElectro Switch Company of Minneapolis, Mn. This assembly is composed on three superposed layers; the top layer being a face plate having a finger switch pattern printed thereon behind which are conductive pads. The second layer is a spacer having openings therein to admit the conductive pads, with pressure-sensitive adhesive on both sides. The third or underlying layer is a flexible printed circuit, connections being made to the printed circuit by a connecting tail. When, therefore, one of the face plate switches is touched, the related conductive pad makes contact with lines on the printed circuit to close the switch.

Operating Circuits

FIG. 4 shows schematically one preferred arrangement for operating the gas discharge bar graph indicators 22, 23 and 24 and the gas discharge digital indicator 25 on front panel FP. In this arrangement, a clock 26 provides the basic timing, and a ramp generator 27 supplies the reference voltage to the comparators 28, 29 and 30. This reference is constantly changing as the ramp rises from its minimum to maximum level. In the controller, the input to the display is a digital value between 0 and 200 from a microprocessor. The ramp generator is a counter, and the comparators operate digitally so that when the counter equals the digital input, the display is turned off.

Comparator 28 compares the process variable signal from channel A with the reference voltage from ramp generator 27 to provide an output which is applied to the anode driver 31 for the process-variable bar graph indicator 22. Comparator 29 compares the set point signal from channel B with the reference voltage to produce an output which is applied to the anode driver 32 for the set-point bar graph indicator 23. Comparator 30 compares the controller output from channel C with the reference voltage to produce an output which is applied to anode driver 33 for the output bar graph indicator 24.

The drive circuit 34 for the bar graph indicators is operated by periodic pulses from clock 28 and is reset by pulses whose rate is a sub-multiple of the clock pulses, these being obtained through a divider 35. The digital readout 25 is operated through appropriate drive circuits 36; and where this readout is to be that of the process variable, an A/D converter 37 is provided to convert the analog process variable in channel A to corresponding digital valued to be supplied to drive circuits 36.

Thus all of the operator interface functions of a conventional controller which are carried out by discrete components on the front panel are now performed in a single gas discharge panel which integrates all of these indicators and controls.

While there has been shown and described a preferred embodiment of a Front Panel for Process Controller in accordance with the invention, it will be appreciated that many changes and modifications may be made therein without, however, departing from the essential spirit thereof.

I claim:

1. In an industrial process electronic controller operable in a manual or automatic mode to compare a signal representing a process variable with a set point signal to produce an output signal that reflects the deviation of the variable from the set point, the output signal being applied to a final control element for governing the process variable, a front display panel free of discrete indicators or switches comprising:

A. a first gas discharge bar graph analog indicator responsive to the process variable signal;
   B. a second gas discharge bar graph analog indicator responsive to the set point signal;
   C. a third gas discharge bar graph analog indicator responsive to the output signal; and
   D. a gas discharge digital indicator responsive to the signal applied to either the first or second indicator, said analog and digital indicators being integrated in a display panel constituted by a non-deflectable front plate spaced a fixed distance from a parallel second plate and peripherally sealed thereto to define a sealed envelope filled with an ionizable gas, said plates having electrodes formed on the internal surfaces thereof appropriate to said first and second analog and said digital indicators whereby all of the analog and digital indications appear and are readable on said common panel, said first and second indicators being vertically disposed on said panel in parallel relation adjacent a graduated scale, said third indicator being horizontal and disposed below said first and second indicators, said display panel further including electrodes formed on the internal surfaces of said plates to define a plurality of touch-sensitive capacitive switches in which said gas functions as a dielectric, said switches each being actuated when the front plate in the region of the electrodes forming the switch is merely touched by an operator, one of said switches, when actuated, causing said controller to operate either in the manual or automatic mode, whereby all of said indicators and said switches are integrated into said sealed, gas-filled envelope which acts as the display panel which is free of discrete indicators or switches.

2. A front display panel as set forth in claim 1, further including second and third capacitive switches, which when the controller operates in the manual mode, cause an increase or decrease in the output signal, depending on which of these switches is operated.

3. A front display panel as set forth in claim 1, further including fourth and fifth capacitive switches, which when the controller is operated either in the automatic or manual mode causes an increase or decrease in the set point signal, depending on which of these switches is operated.

4. A front display panel as set forth in claim 1, further including a plurality of spot electrodes to define gas-discharge pilot lights associated with said switches, each pilot light being illuminated when the associated switch is operated.

* * * * *